United States Patent
Lee et al.

(10) Patent No.: US 7,659,555 B2
(45) Date of Patent: Feb. 9, 2010

(54) LIGHT-EMITTING DIODE

(75) Inventors: Ming-Lum Lee, Tainan County (TW); Shih-Chang Shei, Tainan County (TW)

(73) Assignee: Epistar Corporation, Hsinchu (TW)

(*) Notice: Subject to any disclaimer, the term of this patent is extended or adjusted under 35 U.S.C. 154(b) by 0 days.

(21) Appl. No.: 11/129,905

(22) Filed: May 16, 2005

(65) Prior Publication Data

US 2006/0131597 A1   Jun. 22, 2006

(30) Foreign Application Priority Data

Dec. 17, 2004   (TW)   .............................. 93139452 A (51) Int. Cl.
*H01L 29/24* (2006.01)
*H01L 29/22* (2006.01)

(52) U.S. Cl. ......................................... 257/103; 257/98

(58) Field of Classification Search ................... 257/22, 257/79, 86, 87, 98–100, 103, E33.013, E33.015, 257/E33.016

See application file for complete search history.

(56) References Cited

U.S. PATENT DOCUMENTS

| 6,563,141 B1* | 5/2003 | Dawson et al. ................. 257/98 |
| 2003/0164503 A1* | 9/2003 | Chen ........................... 257/79 |

* cited by examiner

*Primary Examiner*—Hung Vu
(74) *Attorney, Agent, or Firm*—Winston Hsu (57) ABSTRACT

A light-emitting diode (LED) and a method for manufacturing the same are described. The light-emitting diode has a metal substrate, a first transparent conductive layer, a first contact layer, and an illuminating epitaxial structure stacked in sequence. An ohmic contact layer is located on a portion of the illuminating epitaxial structure. A thickness of the metal substrate is greater than 40 μm. The first contact layer is a doped strained-layer-superlattices (SLS) structure. Additionally, the light-emitting diode can further be a reflective layer located between the metal substrate and the first transparent conductive layer.

13 Claims, 11 Drawing Sheets

LIGHT-EMITTING DIODE

RELATED APPLICATIONS

The present application is based on, and claims priority from, Taiwan Application Serial Number 93139452, filed Dec. 17, 2004, the disclosure of which is hereby incorporated by reference herein in its entirety.

FIELD OF THE INVENTION

The present invention relates to a light-emitting diode (LED) and a method for manufacturing the same, and, more particularly, to a light-emitting diode with high efficiency and a method for manufacturing the same.

BACKGROUND OF THE INVENTION

In general, for a light-emitting diode, the light output depends on the quantum efficiency of the active layer and the light extraction efficiency. The higher the quantum efficiency of the active layer, the higher the light output of the light-emitting diode. Generally, the quantum efficiency of the active layer is increased by improving the quality of the epitaxial structure and the structural design of the active layer. In addition, as the light extraction efficiency increases, the light output of the light-emitting diode is enhanced. In order to improve the light extraction efficiency, efforts are made to overcome the significant photon loss resulting from total reflection inside the light-emitting diode after emission from the active layer, the absorbing of the substrate, and the light shielding of the metal. Generally speaking, the problem may be overcome by using a flip-chip LED or by using a transparent substrate.

Besides, since the use of LEDs for illumination has become increasingly popular in recent years and most applications of LEDs as illumination are of high efficiency, the substrate needs to be made of a material with a good heat-dissipating property. The flip-chip LED not only may overcome the photon loss resulting from the light shielding of the metal, but also may achieve the goal of high efficiency and high power by using materials with good heat-dissipating property, such as Si or AlN, as submount substrate. However, as far as the present production technique is concerned, the processes of the flip-chip LED are complicated and the yield is low.

Furthermore, although metal has an excellent heat conduction property and conductivity, the metal substrate is not suitable for an epitaxial substrate. Hence, wafer bonding is generally used to replace the original epitaxial substrate with a substitute substrate. However, the processes are also complicated and the yield is low, especially the yield loss resulting from the step of wafer bonding.

SUMMARY OF THE INVENTION

Therefore, one objective of the present invention is to provide a light-emitting diode and a method for manufacturing the same in which a light-emitting diode with a metal substrate is formed, and thus, the heat dissipation is so good that the light extraction efficiency is greatly increased and further, the light output is raised.

Another objective of the present invention is to provide a light-emitting diode and a method for manufacturing the same, in which the processes of wafer bonding is not needed, and thus the processes are simplified and the yield is raised.

Still another objective of the present invention is to provide a light-emitting diode and the method for manufacturing the same in which the thermal processing is not needed, so that the cracking of the interface may be prevented and the light output of the light-emitting diode may also be raised.

According to the aforementioned objectives, the present invention provides a light-emitting diode comprising a metal substrate, a first transparent conductive layer located on the metal substrate, a first contact layer located on the first transparent conductive layer, an illuminating epitaxial structure located on the first contact layer, and an ohmic contact layer located on part of the illuminating epitaxial structure.

According to an embodiment of the present invention, the light-emitting diode further comprises a reflective layer located between the metal substrate and the first transparent conductive layer. The first contact layer is a doped strained layer superlattice (SLS) structure. In the embodiment of the present invention, the light-emitting diode further comprises a second contact layer and a second transparent conductive layer located between the illuminating epitaxial structure and the ohmic contact layer, in which the second contact layer is located beneath the second transparent conductive layer.

According to another objective, the present invention provides a light-emitting diode comprising a metal substrate, an illuminating epitaxial structure located on the metal substrate, a first contact layer located on the illuminating epitaxial structure, a first transparent conductive layer located on the first contact layer, and an ohmic contact layer located on part of the first transparent conductive layer.

According to another embodiment of the present invention, the light-emitting diode further comprises a metal layer located between the metal substrate and the illuminating epitaxial structure, in which the metal layer is used as a reflective and ohmic contact layer. The first contact layer is a doped strained layer superlattice (SLS) structure. In the embodiment of the present invention, the light-emitting diode further comprises a second contact layer and a second transparent conductive layer located between the illuminating epitaxial structure and the metal substrate, in which the second contact layer is located on the second transparent conductive layer.

According to the objectives, the present invention provides a method for manufacturing a light-emitting diode, comprising the following steps. First, an epitaxial substrate is provided, and an illuminating epitaxial structure is formed on the epitaxial substrate. Then, a first contact layer is formed on the illuminating epitaxial structure, and a first transparent conductive layer is formed on the first contact layer. Afterwards, a metal substrate is formed on the first transparent conductive layer. Then, the epitaxial substrate is removed to expose a surface of the illuminating epitaxial structure. Then, an ohmic contact layer is formed on part of the illuminating epitaxial structure.

According to an embodiment of the present invention, the present invention further comprises forming a reflective layer located on the first transparent conductive layer between the steps of forming the first transparent conductive layer and forming the metal substrate. In the embodiment of the present invention, the thickness of the metal substrate is more than about 40 um. Besides, the first contact layer is a doped strained layer superlattice structure.

According to the objectives, the present invention provides a method for manufacturing a light-emitting diode comprising the following steps. First, an epitaxial substrate is provided, and a first contact layer is formed on the epitaxial substrate. Then, an illuminating epitaxial structure is formed on the first contact layer, and a metal substrate is formed on the illuminating epitaxial structure. Afterwards, the epitaxial substrate is removed to expose a surface of the first contact layer. Then, a first transparent conductive layer is formed on the first contact layer. Then, an ohmic contact layer is formed on part of the first transparent conductive layer.

According to an embodiment of the present invention, the present invention further comprises forming a metal layer located on the illuminating epitaxial structure between the steps of forming the illuminating epitaxial structure and forming the metal substrate, in which the metal layer is used to be as a reflective and ohmic contact layer. In the embodiment of the present invention, the present invention further comprises forming a second contact layer, a second transparent conductive layer and a reflective layer located on the illuminating epitaxial structure in sequence between the steps of forming the illuminating epitaxial structure and forming the metal substrate. In the embodiment of the present invention, the metal substrate is formed by evaporation, sputtering, electroless plating, chemical electroplating, or electroforming. The epitaxial substrate is removed by polishing, chemical etching, or laser stripping.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

The present invention discloses a light-emitting diode and a method for manufacturing the same by which a light-emitting diode and a reflector with a metal substrate may be made. Thus, the heat dissipating is so good that it is suitable for high power use. The light extraction efficiency is greatly increased, and, further, the light output is raised. In order to make the illustration of the present invention more explicit and complete, the following description is stated with reference to FIGS. 1a-1f, FIGS. 2a-2f, and FIGS. 3a-3f.

Reference is made to FIGS. 1a-1f, which are schematic flow diagrams showing the process for manufacturing a light-emitting diode in accordance with an embodiment of the present invention. First, an epitaxial substrate 100 is provided, in which a material of the epitaxial substrate 100 is, for example, sapphire ($Al_2O_3$), silicon carbide (SiC), silicon (Si) or gallium arsenide (GaAs). Then, an illuminating epitaxial structure composed of a cladding layer of a first type 102, an active layer 104 and a cladding layer of a second type 106 is sequentially formed on the epitaxial substrate 100. The cladding layer of a first type 102 can be a III-V semiconductor material of N- or P-type, in which the material may be, for example, $Al_xIn_yGa_{1-x-y}N$ (x,y≧0; 0≦x+y<1; x>c) or $Al_xIn_yGa_{1-x-y}P$ (x,y≧0; 0≦x+y<1; x>c) of N-type or P-type. The material of the active layer 104 may be a doped or undoped quantum well (QW) structure composed of $Al_aIn_bGa_{1-a-b}N/Al_cIn_dGa_{1-c-d}N$ (a,b≧0; 0≦a+b<1; c,d≧0; 0≦c+d<1; x>c>a) or $Al_aIn_bGa_{1-a-b}P/Al_cIn_dGa_{1-c-d}P$ (a,b≧0; 0≦a+b<1; c,d≧0; 0≦c+d<1; x>c>a), and the dopant may be N-type or P-type.

Figure 1A:
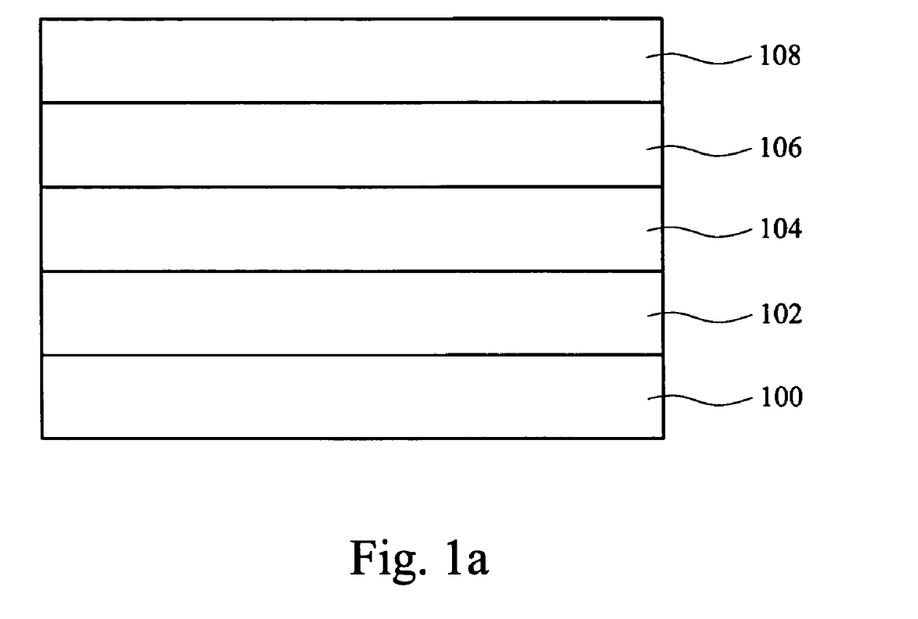
FIGS. 1a-1f are schematic flow diagrams showing the process for manufacturing a light-emitting diode in accordance with an embodiment of the present invention.

The cladding layer of a second type 106 can be a III-V semiconductor material of P- or N-type, in which the material may be, for example, $Al_xIn_yGa_{1-x-y}N$ (x,y≧0; 0≦x+y<1; x>c) or $Al_xIn_yGa_{1-x-y}P$ (x,y≧0; 0≦x+y<1; x>c) of P-type or N-type.

Then, a metal organic chemical vapor deposition (MOCVD) technique is used to form a contact layer 108 on the cladding layer of a second type 106, and a structure as shown in FIG. 1a is formed. The contact layer 108 is preferably a doped strained layer superlattice (SLS) structure, and more preferably a periodic and modulated doped semiconductor material, such as $Al_uIn_vGa_{1-u-v}N/Al_xIn_yGa_{1-x-y}N$ (u,v≧0; 0≦u+v≦1; x,y≧0; 0≦x+y<1; x>u) or $Al_uIn_vGa_{1-u-v}P/Al_xIn_yGa_{1-x-y}P$ (u,v≧0; 0≦u+v≦1; x,y≧0; 0≦x+y<1; x>u), and the dopant may be N-type or P-type. Since the contact feature of the strained layer superlattice structure and a transparent conductive layer 110 subsequently formed is good, the conductivity it supplies is high.

Figure 1B:
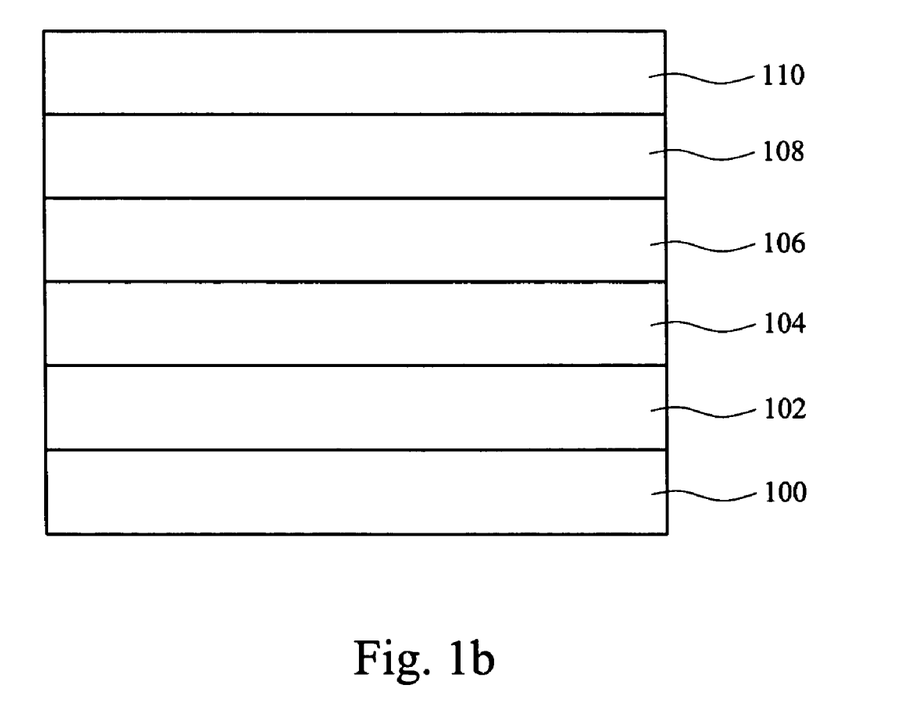

Then, the transparent conductive layer 110 is formed on the contact layer 108. The material of the transparent conductive layer 110 may be a thin metal, such as Ni/Au, TiN, and Pd/Au/Pt/Au, a transparent conductive oxide (TCO) of N-type, such as indium tin oxide (ITO), cadmium tin oxide (CTO), ZnO doped with Al (ZnO:Al; AZO), $AgInO_2$:Sn, and $In_2O_3$:Zn (IZO), or a transparent conductive oxide of P-type, such as $CuAlO_2$, LaCuOS, NiO, $CuGaO_2$ and $SrCu_2O_2$.

A feature of the present invention is the use of the strained layer superlattice structure and the transparent conductive layer. Since thermal processing is not needed, the cracking of the interface is avoided, and, further, the light output of the light-emitting diode is not affected.

Figure 1C:
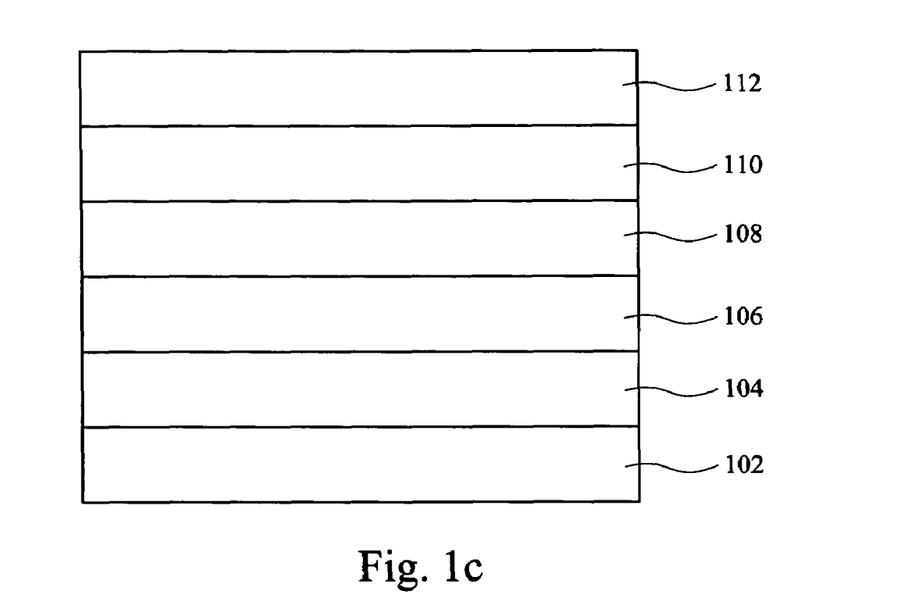
Figure 1D:
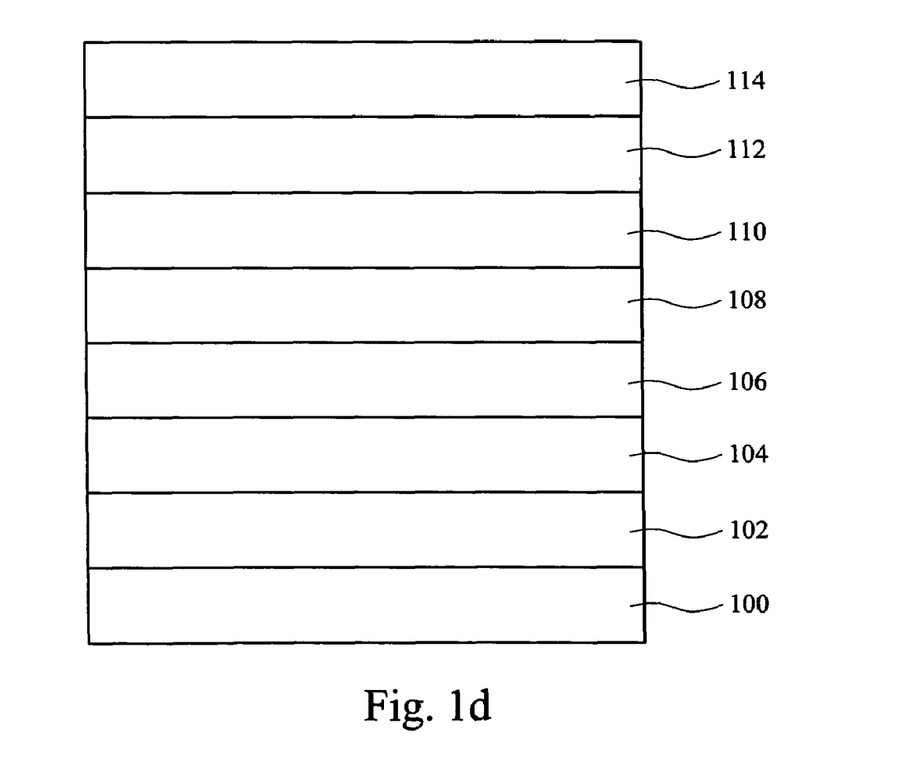

Then, a reflective layer 112 is formed on the transparent conductive layer 110 by, for example, evaporation, sputtering, electroplating, or electroless plating, and a structure as shown in FIG. 1c is formed. The material of the reflective layer 112 is, for example, a reflective material, such as Au, Ag, Al, In, Sn, Pt, Ti, Zn, Pb, AuBe, Ni, PbSn, or AuZn. Besides, the reflective layer 112 may also be a distributed Bragg reflector composed of different kinds of transparent conductive oxide layer stacked on each other in multiple films, such as indium tin oxide/AlZnO (ITO/AZO). After forming the reflective layer 112, a metal substrate 114 is formed on the reflective layer 112 by, for example, evaporation, sputtering, electroless plating, chemical electroplating, or electroforming, and a structure as shown in FIG. 1d is formed. The thickness of the metal substrate 114 is preferably more than about 40 um, and the material of the metal substrate 114 is metal such as, for example, Cu, Al, Ag, Au, Cr, Pt, W, Pb, Sn, Ni or a related alloy suitable for chemical electroplating or electroforming.

A feature of the present invention is the use of the chemical electroplating or electroforming to form the metal substrate. Since the thermal processing is also not needed, cracking of the interface is avoided.

Besides, since the heat conduction of the metal substrate 114 of the present invention is excellent, the heat dissipating property of the light-emitting diode is greatly increased, and further achieves the goal of enhancing the performance of the light-emitting diode. In the present invention, if the material used to form the metal substrate 114 has good reflectivity, formation of the reflective layer 112 may be omitted.

Figure 1E:
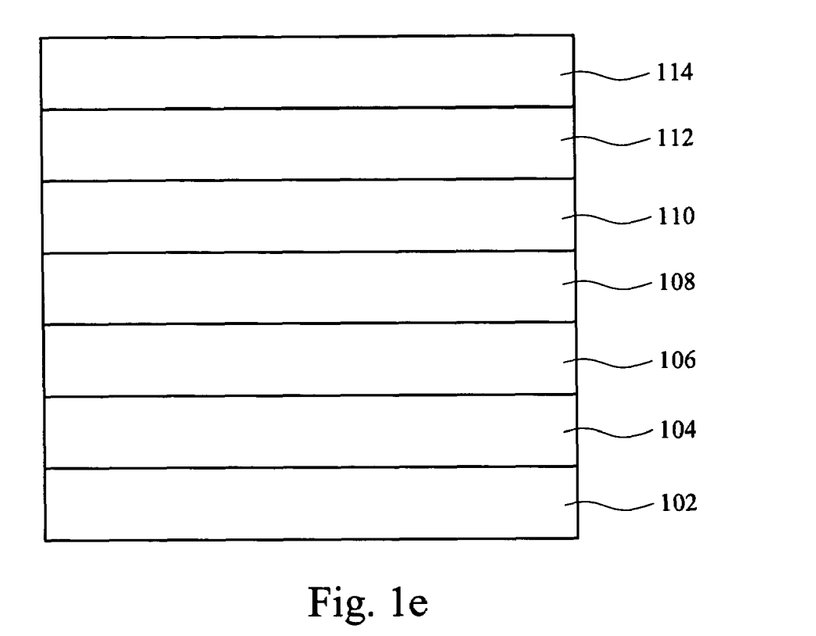

Then, as shown in FIG. 1e, the epitaxial substrate 100 is removed by, for example, polishing, chemical etching, or laser stripping, to expose a surface of the cladding layer of a first type 102. The polishing technique may be chemical mechanical polishing (CMP), and the chemical etching technique may be dry etching or wet etching.

Figure 1F:
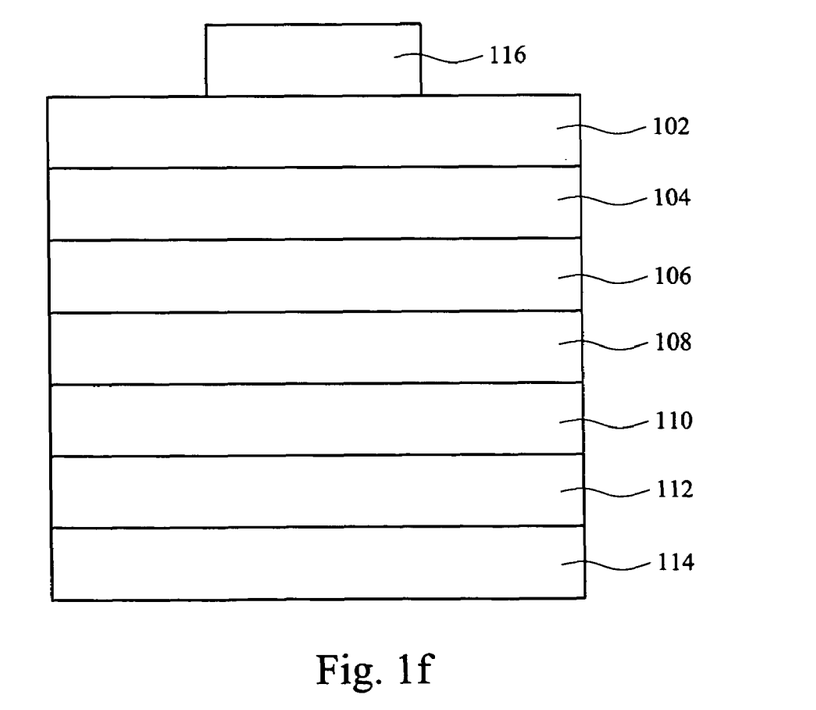

Then, the cladding layer of a first type 102 and the structure thereon is turned over, and an ohmic contact layer 116 is formed on part of the cladding layer of a first type 102, and a structure as shown in FIG. 1f is formed. The material of the ohmic contact layer 116 is, for example, Al, Au, Pt, Ti, Cr, Be, Zn, Mg, Ni, Ge, or any arbitrary alloy thereof. These are materials known to those skilled in the semiconductor art.

When the manufacturing of a light-emitting diode structure of an embodiment of the present invention is finished, the process continues on to the cutting of the dies of the light-emitting diode to finish the manufacturing of a light-emitting diode device. The materials and techniques used in the embodiment may also be applied in other embodiments described below.

Figure 2A:
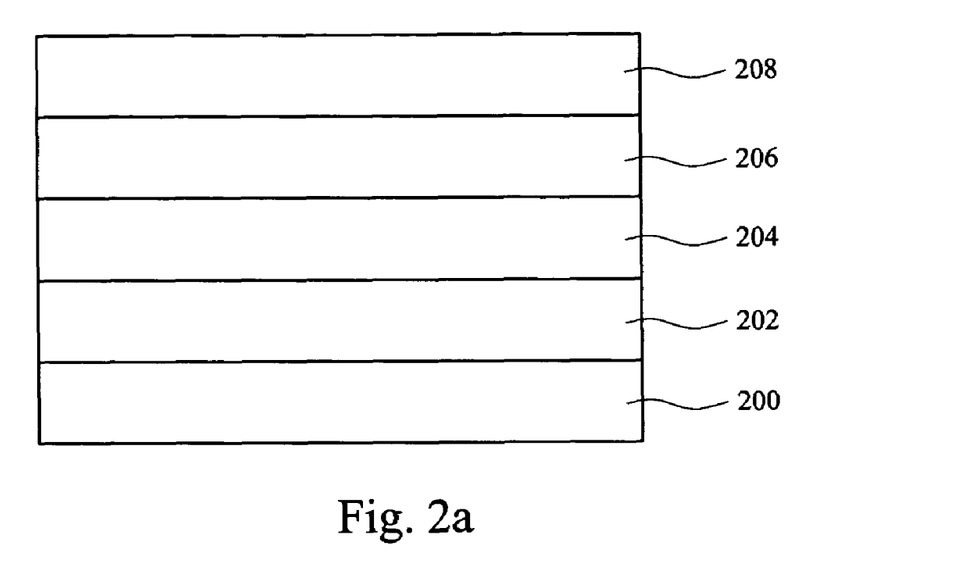
FIGS. 2a-2f are schematic flow diagrams showing the process for manufacturing a light-emitting diode in accordance with another embodiment of the present invention.
Figure 2B:
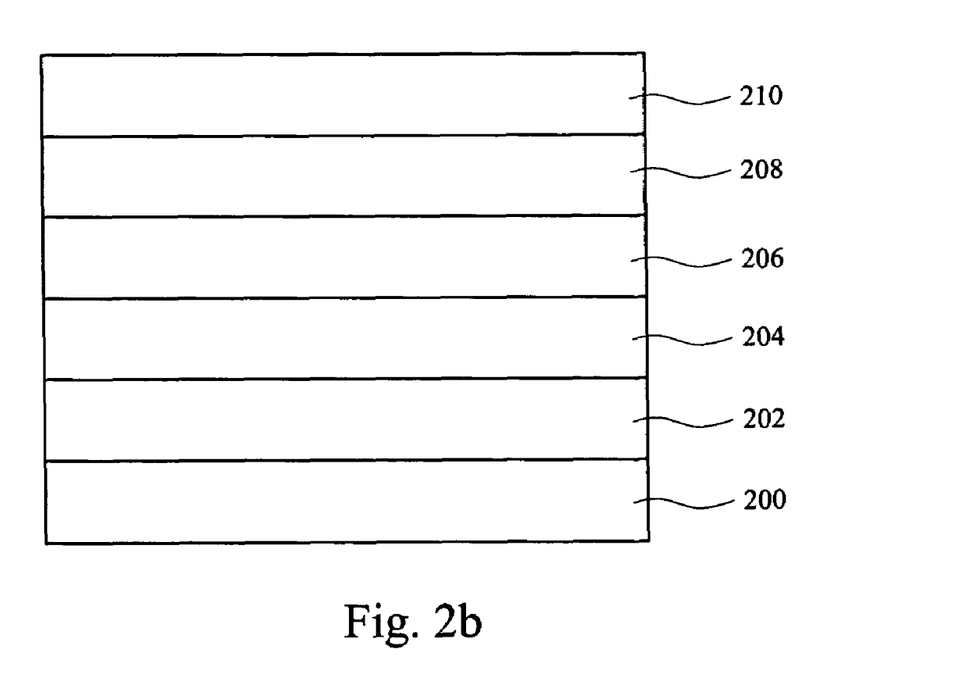
Figure 2C:
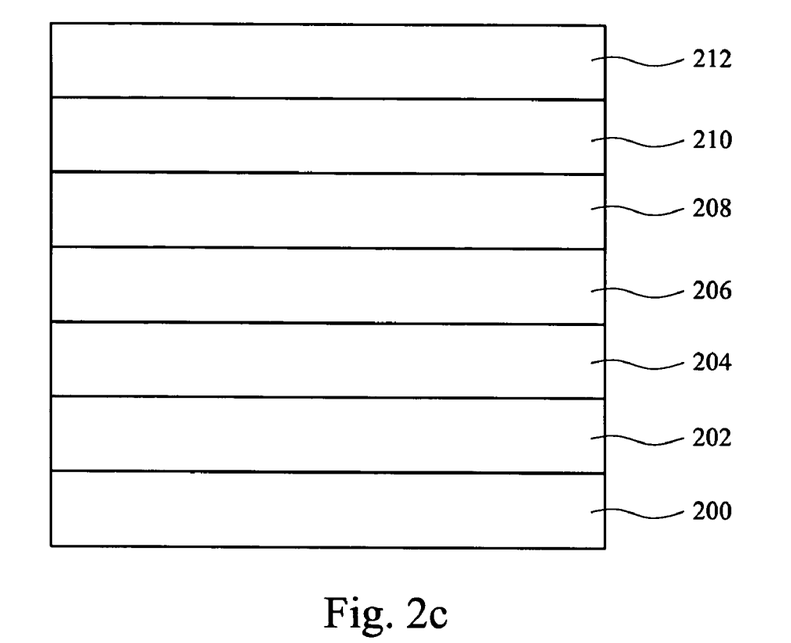
Figure 2D:
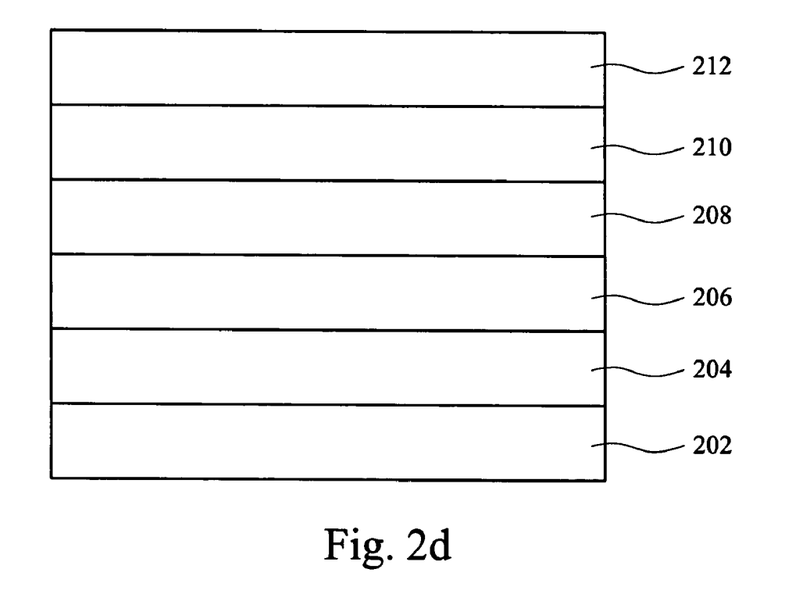
Figure 2E:
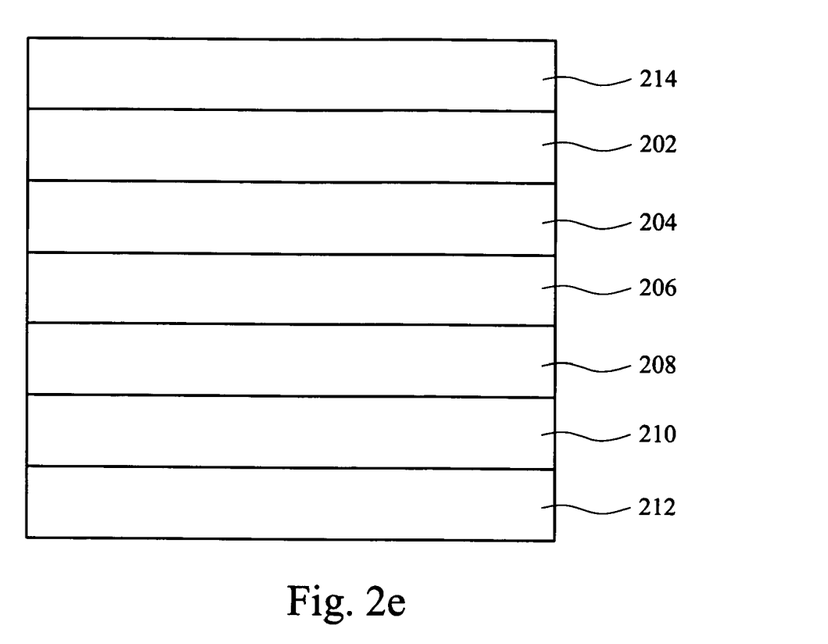
Figure 2F:
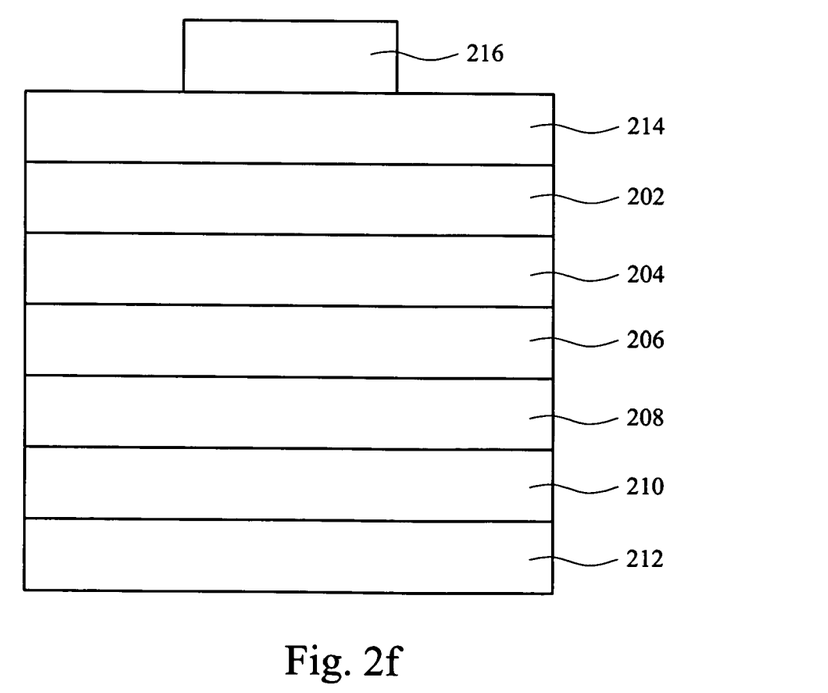

Reference is made to FIGS. 2a-2f, which are schematic flow diagrams showing the process for manufacturing a light-emitting diode in accordance with another embodiment of the present invention. In the embodiment, a contact layer 202 is first formed on the epitaxial substrate 200, and then an illuminating epitaxial structure, composed of a cladding layer of a first type 204, an active layer 206, and a cladding layer of a second type 208, is sequentially formed, as shown in FIG. 2a. Then, a metal layer 210 is formed on the illuminating epitaxial structure, in which the metal layer 210 is used as a reflective and ohmic contact layer. Afterwards, a metal substrate 212 is formed on the metal layer 210, and a structure as shown in FIG. 2c is formed. Then, the epitaxial substrate 200 is removed to expose a surface of the contact layer 202, as shown in FIG. 2d. Then, the contact layer 202 and the structure thereon is turned over, and a transparent conductive layer 214 is formed on part of the contact layer 202. Then, an ohmic contact layer 216 is formed on part of the transparent conductive layer 214, and a structure as shown in FIG. 2f is formed. When the manufacturing of a light-emitting diode structure of another embodiment of the present invention is finished, the process continues on to the cutting of the dies of the light-emitting diode to finish the manufacturing of a light-emitting diode device.

Figure 3A:
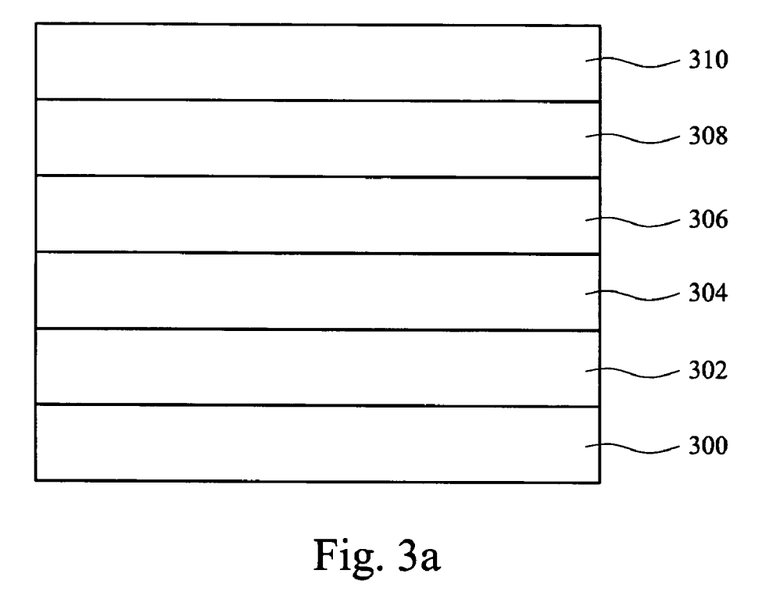
FIGS. 3a-3f are schematic flow diagrams showing the process for manufacturing a light-emitting diode in accordance with another embodiment of the present invention.
Figure 3B:
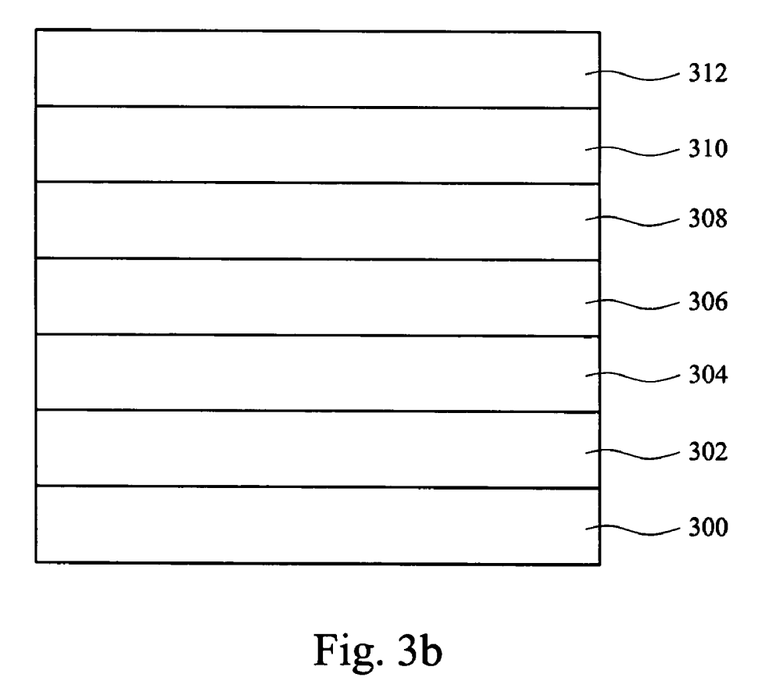
Figure 3C:
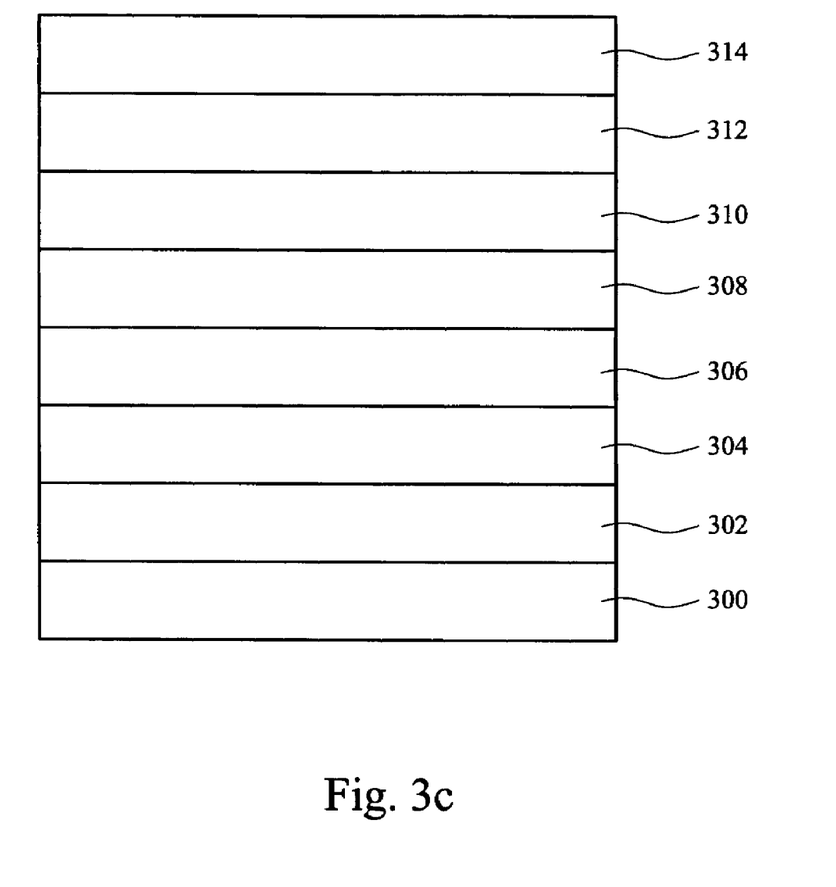
Figure 3D:
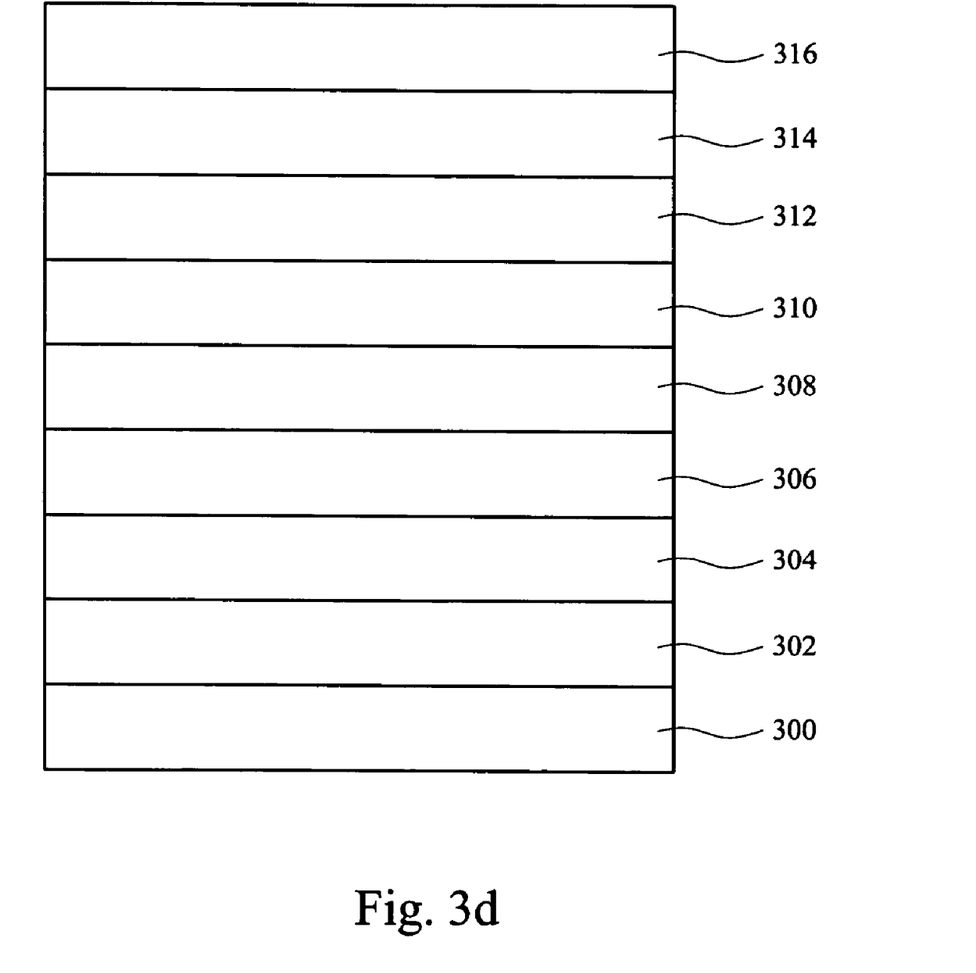
Figure 3E:
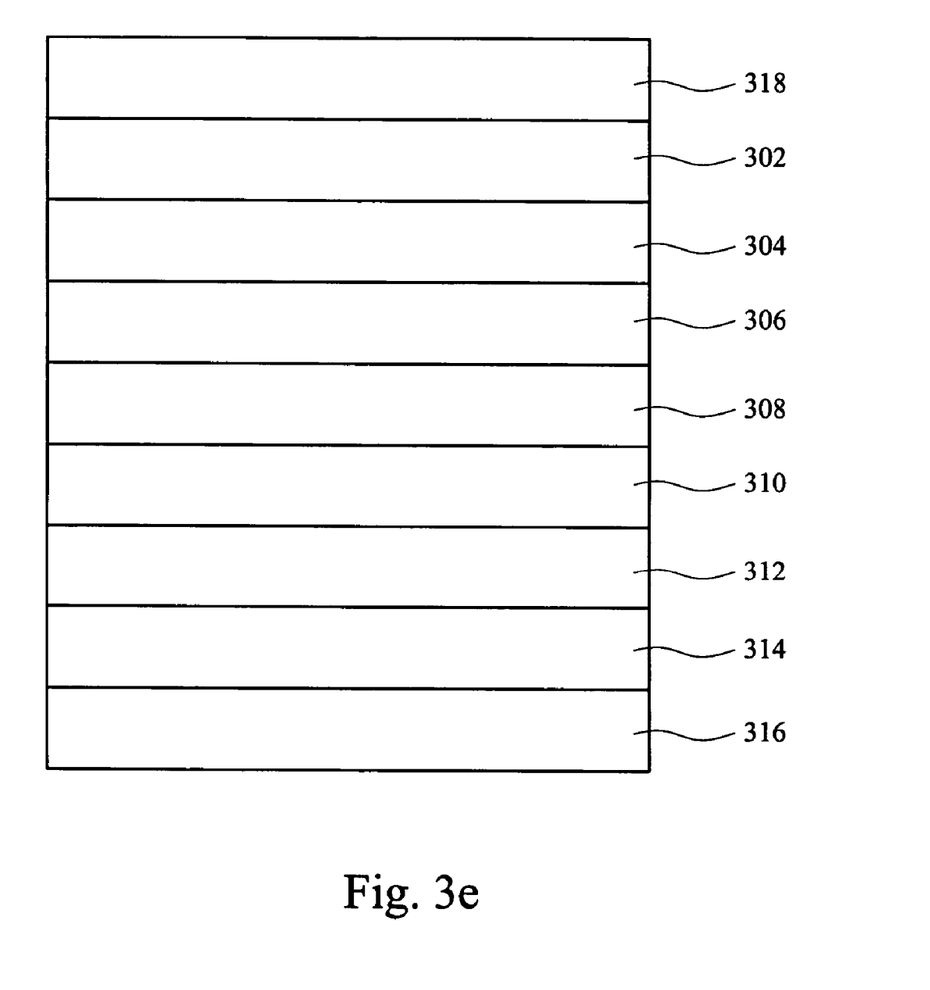
Figure 3F:
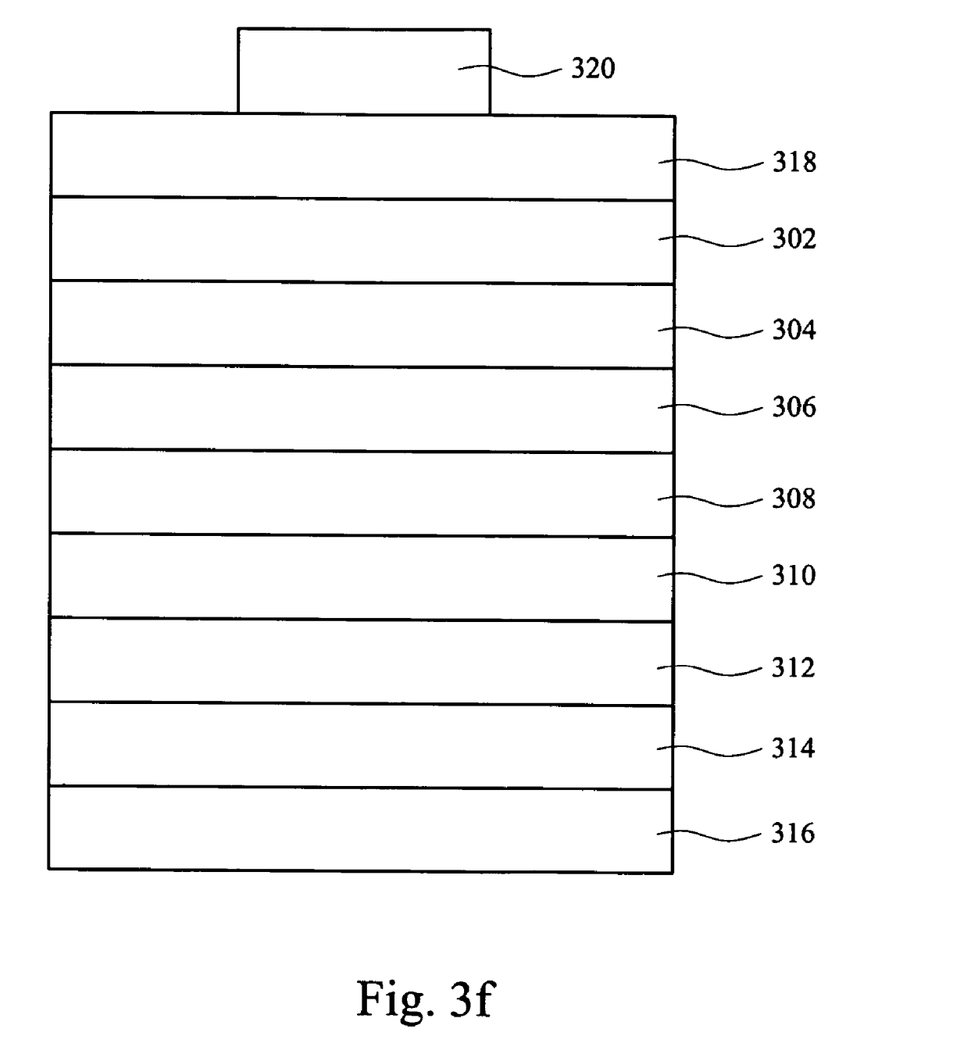

In still another embodiment of the present invention, a first contact layer 302 is first formed on a epitaxial substrate 300, and then an illuminating epitaxial structure, composed of a cladding layer of a first type 304, an active layer 306, and a cladding layer of a second type 308, is sequentially formed. A second contact layer 310 is formed on the illuminating epitaxial structure, and a structure as shown in FIG. 3a is formed. Afterwards, a first transparent conductive layer 312 is formed on the second contact layer 310, and a reflective layer 314 is formed on the first transparent conductive layer 312, as shown in FIG. 3c. Then, a metal substrate 316 is formed on the reflective layer 314, and a structure as shown in FIG. 3d is formed. Then, the epitaxial substrate 300 is removed to expose a surface of the first contact layer 302. The first contact layer 302 and the structure thereon are turned over, and then a second transparent conductive layer 318 is formed on the surface of the first contact layer 302. An ohmic contact layer 320 is formed on part of the second transparent conductive layer 318, and a structure as shown in FIG. 3f is formed. When manufacturing of a light-emitting diode structure of the embodiment of the present invention is finished, the process continues on to the cutting of the dies of the light-emitting diode to finish the manufacturing of a light-emitting diode device.

According to the embodiments of the present invention, there are some advantages in applying the present invention. First, the light-emitting diode of the present invention has a metal substrate, and thus the heat dissipating ability of the light-emitting diode is greatly raised. Furthermore, the light-emitting diode of the present invention has a reflective layer, so that the light extraction efficiency of the light-emitting diode is increased, and the light output is also enhanced. Besides, the process of wafer bonding is not needed in the light-emitting diode of the present invention, and therefore, the processes are simplified and the yield is raised. On the other hand, the thermal processing is also not needed in the light-emitting diode of the present invention, so cracking of the interface is avoided and the light output of the light-emitting diode is also raised.

As is understood by a person skilled in the art, the foregoing preferred embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A light-emitting diode (LED), comprising:
   a substrate;
   a non-semiconductor transparent conductive layer located on the substrate;
   a doped strained layer superlattice structure having a bottom surface, wherein whole of the bottom surface directly contacts the non-semiconductor transparent conductive layer;
   an illuminating epitaxial structure located on the doped strained layer superlattice structure; and
   an ohmic contact layer contacting the illuminating epitaxial structure.

2. The light-emitting diode according to claim 1, further comprising a reflective layer located between the substrate and the non-semiconductor transparent conductive layer, wherein a material of the reflective layer is selected from a group consisting of Au, Ag, Al, In, Sn, Pt, Ti, Zn, Pb, AuBe, Ni, PbSn, and AuZn, or the material of the reflective layer is a distributed Bragg reflector composed of different kinds of transparent conductive oxide (TCO) layer stacked on each other in multiple films.

3. The light-emitting diode according to claim 1, wherein a material of the substrate comprises a conductive material selected from a group consisting of Cu, Al, Ag, Au, Cr, Pt, W, Pb, Sn, Ni and an alloy thereof.

4. The light-emitting diode according to claim 1, wherein a material of the non-semiconductor transparent conductive layer is selected from a group consisting of Ni/Au, TiN, Pd/Au/Pt/Au, ITO, cadmium tin oxide (CTO), ZnO doped with Al (ZnO:Al; AZO), $AgInO_2$:Sn, $In_2O_3$:Zn (IZO), $CuAlO_2$, LaCuOS, NiO, $CuGaO_2$, and $SrCu_2O_2$.

5. A light-emitting diode (LED), comprising:
   a substrate;
   a non-semiconductor transparent conductive layer located on the substrate;
   a doped strained layer superlattice structure contacting the non-semiconductor transparent conductive layer, wherein no intervening material is formed between the doped strained layer superlattice structure and the non-semiconductor transparent conductive layer;
   an illuminating epitaxial structure, located on the doped strained layer superlattice structure; and
   an ohmic contact layer located on the on the illuminating epitaxial structure.

6. The light-emitting diode according to claim 5, further comprising a reflective layer located between the substrate and the non-semiconductor transparent conductive layer, wherein a material of the reflective layer is selected from a group consisting of Au, Ag, Al, In, Sn, Pt, Ti, Zn, Pb, AuBe, Ni, PbSn, and AuZn, or the material of the reflective layer is a distributed Bragg reflector composed of different kinds of transparent conductive oxide (TCO) layer stacked on each other in multiple films.

7. The light-emitting diode according to claim 5, wherein the substrate comprises a conductive material selected from a group consisting of Cu, Al, Ag, Au, Cr, Pt, W, Pb, Sn, Ni and an alloy thereof.

8. The light-emitting diode according to claim 5, wherein a material of the non-semiconductor transparent conductive layer is selected from a group consisting of Ni/Au, TiN, Pd/Au/Pt/Au, ITO, cadmium tin oxide (do), ZnO doped with Al (ZnO:Al; AZO), $AgInO_2$:Sn, $In_2O_3$:Zn (IZO), $CuAlO_2$, LaCuOS, NiO, $CuGaO_2$, and $SrCu_2O_2$.

9. A light-emitting diode (LED), comprising:
a non-semiconductor transparent conductive layer;
a doped strained layer superlattice structure contacting the non-semiconductor transparent conductive layer, wherein no intervening material is formed between the doped strained layer superlattice structure and the non-semiconductor transparent conductive layer;
an illuminating epitaxial structure coupled to the doped strain layer superlattice structure; and
an ohmic contact layer coupled to the illuminating epitaxial structure.

10. The light-emitting diode according to claim 9, further comprising a reflective layer located between the substrate and the non-semiconductor transparent conductive layer, wherein a material of the reflective layer is selected from a group consisting of Au, Ag, Al, In, Sn, Pt, Ti, Zn, Pb, AuBe, Ni, PbSn, and AuZn, or the material of the reflective layer is a distributed Bragg reflector composed of different kinds of transparent conductive oxide (TCO) layer stacked on each other in multiple films, and a material of the distributed Bragg reflector is indium tin oxide/AlZnO (ITO/AZO).

11. The light-emitting diode according to claim 9, further comprising a substrate coupled to the non-semiconductor transparent conductive layer or the ohmic contact layer.

12. The light-emitting diode according to claim 11, wherein the substrate comprises a conductive material selected from a group consisting of Cu, Al, Ag, Au, Cr, Pt, W, Pb, Sn, Ni and an alloy thereof.

13. The light-emitting diode according to claim 9, wherein a material of the non-semiconductor transparent conductive layer is selected from a group consisting of Ni/Au, TiN, Pd/Au/Pt/Au, ITO, cadmium tin oxide (CTO), ZnO doped with Al (ZnO:Al; AZO), $AgInO_2$:Sn, $In_2O_3$:Zn (IZO), $CuAlO_2$, LaCuOS, NiO, $CuGaO_2$, and $SrCu_2O_2$.

* * * * *